(12) United States Patent
Huisman et al.

(10) Patent No.: US 11,733,614 B2
(45) Date of Patent: *Aug. 22, 2023

(54) METHOD OF METROLOGY AND ASSOCIATED APPARATUSES

(71) Applicant: ASML Netherlands B.V., Veldhoven (NL)

(72) Inventors: Thomas Jarik Huisman, Eindhoven (NL); Ruben Cornelis Maas, Utrecht (NL); Hermanus Adrianus Dillen, Maarheeze (NL)

(73) Assignee: ASML Netherlands B.V., Veldhoven (NL)

( * ) Notice: Subject to any disclaimer, the term of this patent is extended or adjusted under 35 U.S.C. 154(b) by 34 days.

This patent is subject to a terminal disclaimer.

(21) Appl. No.: 17/467,441

(22) Filed: Sep. 6, 2021

(65) Prior Publication Data

US 2022/0107571 A1 Apr. 7, 2022

Related U.S. Application Data

(63) Continuation of application No. 16/362,025, filed on Mar. 22, 2019, now Pat. No. 11,112,703.

(30) Foreign Application Priority Data

Mar. 23, 2018 (EP) .................................... 18163680

(51) Int. Cl.
*G06T 7/12* (2017.01)
*G03F 7/00* (2006.01)
(Continued)

(52) U.S. Cl.
CPC .......... *G03F 7/70625* (2013.01); *G01B 9/04* (2013.01); *G03F 1/84* (2013.01); *G03F 1/86* (2013.01);
(Continued)

(58) Field of Classification Search
CPC .......... G03F 7/70625; G03F 1/84; G03F 1/86; G03F 7/70433; G03F 7/70633;
(Continued)

(56) References Cited

U.S. PATENT DOCUMENTS 7,072,525 B1 7/2006 Covell
7,203,234 B1 4/2007 Zeng
(Continued)

FOREIGN PATENT DOCUMENTS

EP 3543791 9/2019
TW I597494 B 9/2017

OTHER PUBLICATIONS

First Office Action from the Patent Office of the People's Republic of China issued in related Chinese Patent Application No. 2019800208161; dated Aug. 23, 2022 (14 pgs.).
(Continued)

*Primary Examiner* — Jose L Couso
(74) *Attorney, Agent, or Firm* — Finnegan, Henderson, Farabow, Garrett & Dunner, LLP (57) ABSTRACT

Disclosed is a method of, and associated apparatus for, determining an edge position relating to an edge of a feature comprised within an image, such as a scanning electron microscope image, which comprises noise. The method comprises determining a reference signal from said image; and determining said edge position with respect to said reference signal. The reference signal may be determined from the image by applying a 1-dimensional low-pass filter to the image in a direction parallel to an initial contour estimating the edge position.

18 Claims, 3 Drawing Sheets

(51) Int. Cl.
  *G01B 9/04* (2006.01)
  *G03F 1/84* (2012.01)
  *G03F 1/86* (2012.01)

(52) U.S. Cl.
  CPC ...... *G06T 7/12* (2017.01); *G06T 2207/10061* (2013.01); *G06T 2207/20168* (2013.01); *G06T 2207/30148* (2013.01)

(58) Field of Classification Search
  CPC .......... G01B 9/04; G01B 15/04; G01B 11/24; G01B 2201/56; G06T 7/12; G06T 2207/10061; G06T 2207/20168; G06T 2207/30148; G06T 7/001; G06T 7/002; G06T 7/004; G06T 7/0012; G06T 7/13; G06T 7/40; G06T 7/42; G06T 7/49; G06T 2207/20192; G06T 2207/20116; G06T 7/0002; G06T 7/74; G06T 2207/30141; G06T 2207/30168; G06K 9/6255; G06K 9/6254; G06K 9/00; G06V 2201/06; G06V 10/245; G06V 10/44; G06V 10/772; G06V 10/98; H04N 19/117; H04N 1/4092; H04N 19/80; H04N 9/646; G01Q 30/02; G01Q 30/06; H01J 2237/2814; H01J 2237/2817; H01J 37/222; H01J 2237/221; H01L 22/20
  See application file for complete search history.

(56) References Cited

U.S. PATENT DOCUMENTS

| | | |
|---|---|---|
| 7,269,287 B2 | 9/2007 | Shishido et al. |
| 9,858,659 B2 | 1/2018 | Minakawa et al. |
| 10,937,146 B2 | 3/2021 | Shinoda et al. |
| 2001/0053243 A1 | 12/2001 | Norioka et al. |
| 2002/0131638 A1 | 9/2002 | He et al. |
| 2003/0126566 A1 | 7/2003 | Salto |
| 2005/0096528 A1 | 5/2005 | Fritz et al. |
| 2005/0219633 A1 | 10/2005 | Chien |
| 2006/0050783 A1 | 3/2006 | Dinh et al. |
| 2008/0197280 A1 | 8/2008 | Tanaka et al. |
| 2009/0202139 A1 | 8/2009 | Toyoda et al. |
| 2009/0218491 A1 | 9/2009 | Morokuma et al. |
| 2015/0215595 A1 | 7/2015 | Yoshida |
| 2015/0228063 A1 | 8/2015 | Minakawa et al. |
| 2016/0070971 A1* | 3/2016 | Nakashima ............... G06T 7/74 348/87 |
| 2016/0071263 A1 | 3/2016 | Thiruvenkadam et al. |
| 2016/0155015 A1 | 6/2016 | Bendall |
| 2017/0032535 A1 | 2/2017 | Harding et al. |
| 2017/0345615 A1 | 11/2017 | Zotta et al. |
| 2019/0033728 A1 | 1/2019 | Takagi et al. |
| 2019/0219933 A1 | 7/2019 | Cao et al. |
| 2019/0295237 A1 | 9/2019 | Konecky et al. |
| 2019/0391500 A1 | 12/2019 | Kiers et al. |
| 2020/0004138 A1 | 1/2020 | Budach et al. |
| 2021/0066027 A1* | 3/2021 | Mack ..................... G06T 7/42 |
| 2021/0142977 A1* | 5/2021 | Mack ..................... H01J 37/28 |

OTHER PUBLICATIONS

Notification of Reason(s) for Refusal issued in related Korean Patent Application No. 10-2020-7027309; dated Jun. 28, 2022 (12 pgs.).

Mack et al.; "Using the Analytical Linescan Model for SEM Metrology", Proc. of SPIE, vol. 10145, pp. 101451R-1-101451R-8 (2017).

Verduin et al.; "Determination of Line Edge Roughness in Low-Dose Top-Down Scanning Electron Microscopy Images", J. Micro/ Nanolith. MEMS MOEMS, vol. 13, No. 3, pp. 033009-1-033009-10 (2014).

Verduin et al.; "Determination of Line Edge Roughness in Low Dose Top-Down Scanning Electron Microscopy Images", Visual Communications and Image Processing, Proc. of SPIE, vol. 9050, pp. 90500L1-90500L17 (2014).

Office Action of the Intellectual Property Office of Taiwan issued in related Taiwanese Patent Application No. 111107030; dated Feb. 21, 2023 (8 pgs.).

* cited by examiner

METHOD OF METROLOGY AND ASSOCIATED APPARATUSES

CROSS-REFERENCE TO RELATED APPLICATIONS

This application is a continuation of application Ser. No. 16/362,025, filed Mar. 22, 2019, which claims priority of EP application 18163680.4 which was filed on Mar. 23, 2018. The disclosures of the above-referenced applications are incorporated herein by reference in their entireties.

BACKGROUND

Field

The embodiments of the present disclosure relate to methods and apparatus for applying patterns to a substrate in a lithographic process, and measurement thereof.

Background

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

In order to monitor the lithographic process, parameters of the patterned substrate are measured. Parameters may include, for example, the overlay error between successive layers formed in or on the patterned substrate and critical linewidth or critical dimension (CD) of developed photosensitive resist. This measurement may be performed on a product substrate or on a dedicated metrology target. There are various techniques for making measurements of the microscopic structures formed in lithographic processes, including the use of scanning electron microscopes and various specialized tools.

In performing lithographic processes, such as application of a pattern on a substrate or measurement of such a pattern, process control methods are used to monitor and control the process. Such process control techniques are typically performed to obtain corrections for control of the lithographic process. It would be desirable to improve such process control methods.

SUMMARY

The embodiments of the present disclosure provide a method of determining an edge position relating to an edge of a feature comprised within an image which comprises noise; said method comprising: determining a reference signal from said image; and determining said edge position with respect to said reference signal.

The embodiments of the present disclosure provide a computing apparatus comprising a processor, and being configured to perform the method of determining an edge position relating to an edge of a feature comprised within an image which comprises noise; said method comprising: determining a reference signal from said image; and determining said edge position with respect to said reference signal.

The embodiments of the present disclosure provide a scanning electron microscopy inspection apparatus being operable to image a plurality of features on a substrate, and comprising the computing apparatus of the second aspect.

The embodiments of the present disclosure provide a computer program comprising program instructions operable to perform the method of determining an edge position relating to an edge of a feature comprised within an image which comprises noise; said method comprising: determining a reference signal from said image; and determining said edge position with respect to said reference signal.

Further aspects, features and advantages of the disclosed embodiments, as well as the structure and operation thereof, are described in detail below with reference to the accompanying drawings. It is noted that the scope is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS

Embodiments of the present disclosure will now be described, by way of example, with reference to the following drawings.

DETAILED DESCRIPTION

Before describing embodiments in detail, it is instructive to present an example environment in which the embodiments of the present disclosure may be implemented.

Figure 1:
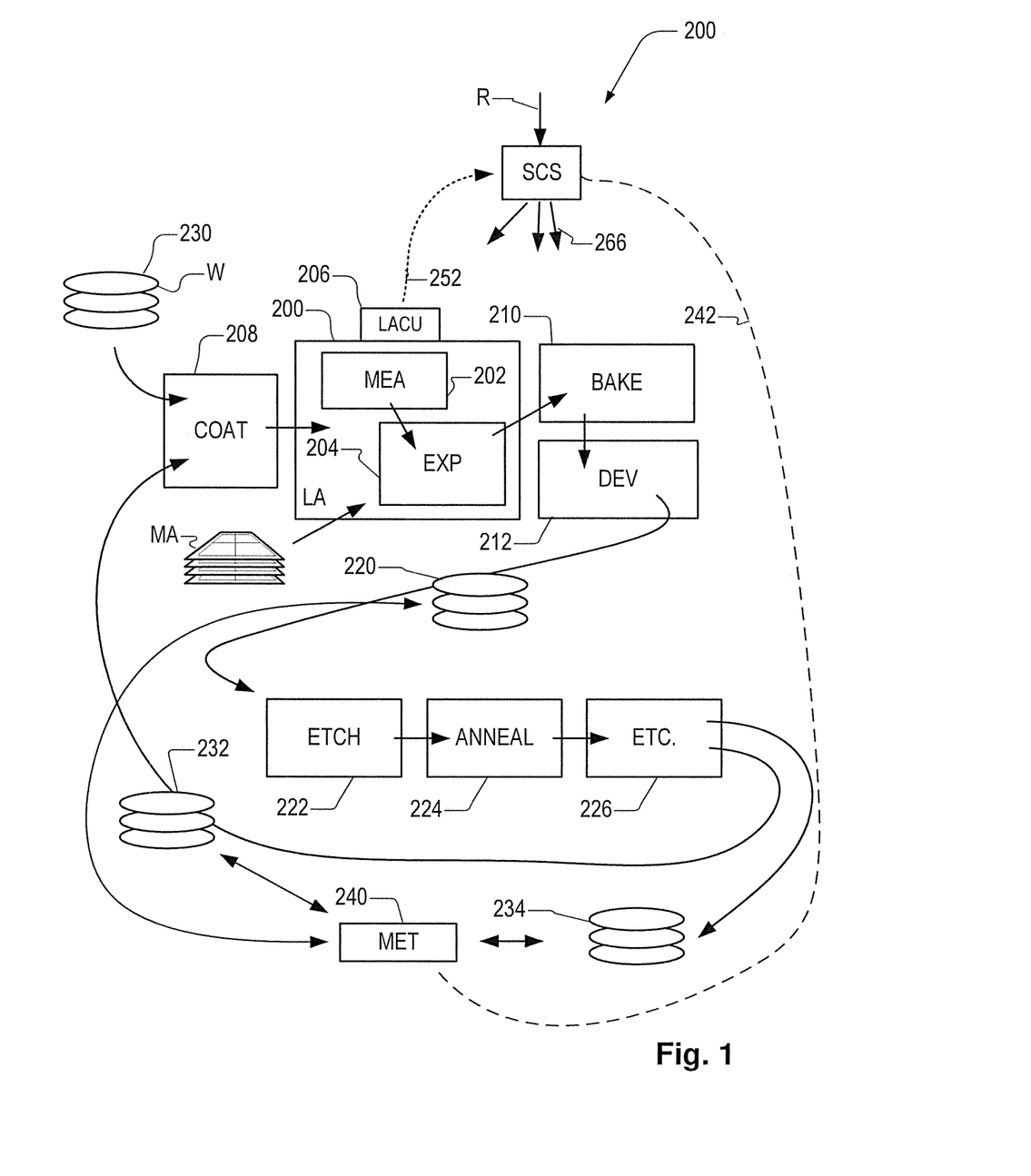
FIG. 1 depicts a lithographic apparatus together with other apparatuses forming a production facility for semiconductor devices, consistent with embodiments of the present disclosure.

FIG. 1 at 200 shows a lithographic apparatus LA as part of an industrial production facility implementing a high-volume, lithographic manufacturing process. In the present example, the manufacturing process is adapted for the manufacture of semiconductor products (integrated circuits) on substrates such as semiconductor wafers. The skilled person will appreciate that a wide variety of products can be manufactured by processing different types of substrates in variants of this process. The production of semiconductor products is used purely as an example which has great commercial significance today.

Within the lithographic apparatus (or "litho tool" 200 for short), a measurement station MEA is shown at 202 and an exposure station EXP is shown at 204. A control unit LACU is shown at 206. In this example, each substrate visits the measurement station and the exposure station to have a pattern applied. In an optical lithographic apparatus, for example, a projection system is used to transfer a product pattern from a patterning device MA onto the substrate using conditioned radiation and a projection system. This is done by forming an image of the pattern in a layer of radiation-sensitive resist material.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. The patterning MA device may be a mask or reticle, which imparts a pattern to a radiation beam transmitted or reflected by the patterning device. Well-known modes of operation include a stepping mode and a scanning mode. As is well known, the projection system may cooperate with support and positioning systems for the substrate and the patterning device in a variety of ways to apply a desired pattern to many target portions across a substrate. Programmable patterning devices may be used instead of reticles having a fixed pattern. The radiation for example may include electromagnetic radiation in the deep ultraviolet (DUV) or extreme ultraviolet (EUV) wavebands. The present disclosure is also applicable to other types of lithographic process, for example imprint lithography and direct writing lithography, for example by electron beam.

The lithographic apparatus control unit LACU which controls all the movements and measurements of various actuators and sensors to receive substrates W and reticles MA and to implement the patterning operations. LACU also includes signal processing and data processing capacity to implement desired calculations relevant to the operation of the apparatus. In practice, control unit LACU will be realized as a system of many sub-units, each handling the real-time data acquisition, processing and control of a sub-system or component within the apparatus.

Before the pattern is applied to a substrate at the exposure station EXP, the substrate is processed in at the measurement station MEA so that various preparatory steps may be carried out. The preparatory steps may include mapping the surface height of the substrate using a level sensor and measuring the position of alignment marks on the substrate using an alignment sensor. The alignment marks are arranged nominally in a regular grid pattern. However, due to inaccuracies in creating the marks and also due to deformations of the substrate that occur throughout its processing, the marks deviate from the ideal grid. Consequently, in addition to measuring position and orientation of the substrate, the alignment sensor in practice must measure in detail the positions of many marks across the substrate area, if the apparatus is to print product features at the correct locations with very high accuracy. The apparatus may be of a so-called dual stage type which has two substrate tables, each with a positioning system controlled by the control unit LACU. While one substrate on one substrate table is being exposed at the exposure station EXP, another substrate can be loaded onto the other substrate table at the measurement station MEA so that various preparatory steps may be carried out. The measurement of alignment marks is therefore very time-consuming and the provision of two substrate tables enables a substantial increase in the throughput of the apparatus. If the position sensor IF is not capable of measuring the position of the substrate table while it is at the measurement station as well as at the exposure station, a second position sensor may be provided to enable the positions of the substrate table to be tracked at both stations. Lithographic apparatus LA may for example be of a so-called dual stage type which has two substrate tables and two stations—an exposure station and a measurement station—between which the substrate tables can be exchanged.

Within the production facility, apparatus 200 forms part of a "litho cell" or "litho cluster" that contains also a coating apparatus 208 for applying photosensitive resist and other coatings to substrates W for patterning by the apparatus 200. At an output side of apparatus 200, a baking apparatus 210 and developing apparatus 212 are provided for developing the exposed pattern into a physical resist pattern. Between all of these apparatuses, substrate handling systems take care of supporting the substrates and transferring them from one piece of apparatus to the next. These apparatuses, which are often collectively referred to as the track, are under the control of a track control unit which is itself controlled by a supervisory control system SCS, which also controls the lithographic apparatus via lithographic apparatus control unit LACU. Thus, the different apparatus can be operated to maximize throughput and processing efficiency. Supervisory control system SCS receives recipe information R which provides in great detail a definition of the steps to be performed to create each patterned substrate.

Once the pattern has been applied and developed in the litho cell, patterned substrates 220 are transferred to other processing apparatuses such as are illustrated at 222, 224, 226. A wide range of processing steps is implemented by various apparatuses in a typical manufacturing facility. For the sake of example, apparatus 222 in this embodiment is an etching station, and apparatus 224 performs a post-etch annealing step. Further physical or chemical processing steps are applied in further apparatuses, 226, etc. Numerous types of operation can be required to make a real device, such as deposition of material, modification of surface material characteristics (oxidation, doping, ion implantation etc.), chemical-mechanical polishing (CMP), and so forth. The apparatus 226 may, in practice, represent a series of different processing steps performed in one or more apparatuses. As another example, apparatus and processing steps may be provided for the implementation of self-aligned multiple patterning, to produce multiple smaller features based on a precursor pattern laid down by the lithographic apparatus.

As is well known, the manufacture of semiconductor devices involves many repetitions of such processing, to build up device structures with appropriate materials and patterns, layer-by-layer on the substrate. Accordingly, substrates 230 arriving at the litho cluster may be newly prepared substrates, or they may be substrates that have been processed previously in this cluster or in another apparatus entirely. Similarly, depending on the required processing, substrates 232 on leaving apparatus 226 may be returned for a subsequent patterning operation in the same litho cluster, they may be destined for patterning operations in a different cluster, or they may be finished products to be sent for dicing and packaging.

Each layer of the product structure can utilize a different set of process steps, and the apparatuses 226 used at each layer may be completely different in type. Further, even where the processing steps to be applied by the apparatus 226 are nominally the same, in a large facility, there may be several supposedly identical machines working in parallel to perform the step 226 on different substrates. Small differences in set-up or faults between these machines can mean that they influence different substrates in different ways. Even steps that are relatively common to each layer, such as etching (apparatus 222) may be implemented by several etching apparatuses that are nominally identical but working in parallel to maximize throughput. In practice, moreover, different layers require different etch processes, for example chemical etches, plasma etches, according to the details of the material to be etched, and special requirements such as, for example, anisotropic etching.

The previous or subsequent processes may be performed in other lithography apparatuses, as just mentioned, and may even be performed in different types of lithography apparatus. For example, some layers in the device manufacturing process which are very demanding in parameters such as resolution and overlay may be performed in a more advanced lithography tool than other layers that are less demanding Therefore, some layers may be exposed in an immersion type lithography tool, while others are exposed in a 'dry' tool. Some layers may be exposed in a tool working at DUV wavelengths, while others are exposed using EUV wavelength radiation.

In order that the substrates that are exposed by the lithographic apparatus are exposed correctly and consistently, it is desirable to inspect exposed substrates to measure properties such as overlay errors between subsequent layers, line thicknesses, critical dimensions (CD), etc. Accordingly a manufacturing facility in which litho cell LC is located also includes metrology system which receives some or all of the substrates W that have been processed in the litho cell. Metrology results are provided directly or indirectly to the supervisory control system SCS. If errors are detected, adjustments may be made to exposures of subsequent substrates, especially if the metrology can be done soon and fast enough that other substrates of the same batch are still to be exposed. Also, already exposed substrates may be stripped and reworked to improve yield, or discarded, thereby avoiding performing further processing on substrates that are known to be faulty. In a case where only some target portions of a substrate are faulty, further exposures can be performed only on those target portions which are good.

Also shown in FIG. 1 is a metrology apparatus 240 which is provided for making measurements of parameters of the products at desired stages in the manufacturing process. A common example of a metrology station in a modern lithographic production facility is a scatterometer, for example a dark-field scatterometer, an angle-resolved scatterometer or a spectroscopic scatterometer, and it may be applied to measure properties of the developed substrates at 220 prior to etching in the apparatus 222. Using metrology apparatus 240, it may be determined, for example, that important performance parameters such as overlay or critical dimension (CD) do not meet specified accuracy requirements in the developed resist. Prior to the etching step, the opportunity exists to strip the developed resist and reprocess the substrates 220 through the litho cluster. The metrology results 242 from the apparatus 240 can be used to maintain accurate performance of the patterning operations in the litho cluster, by supervisory control system SCS or control unit LACU 206 making small adjustments over time, thereby minimizing the risk of products being made out-of-specification, and requiring re-work.

Additionally, metrology apparatus 240 or other metrology apparatuses (not shown) can be applied to measure properties of the processed substrates 232, 234, and incoming substrates 230. The metrology apparatus can be used on the processed substrate to determine important parameters such as overlay or CD.

Another example of a metrology station is a scanning electron microscope (SEM), otherwise referred to as an electron beam (e-beam) metrology device, which may be included in addition to, or as an alternative to, a scatterometer. As such, metrology apparatus 240 may comprise an e-beam or SEM metrology device, either alone or in addition to a scatterometer. E-beam and SEM metrology devices have the advantage of measuring features directly (e.g., they directly image the features), rather than the indirect measurement techniques used in scatterometry (where parameter values are determined from reconstruction from or asymmetry in diffraction orders of radiation diffracted by the structure being measured). The main disadvantage with e-beam or SEM metrology devices is their measurement speed, which is much slower than scatterometry, limiting their potential application to specific offline monitoring processes.

Critical dimension scanning electron microscopy (CD-SEM) is a technique widely used for substrate and mask metrology in the semiconductor industry. In CD-SEM, low energy electrons (<1 keV) are accelerated towards a surface into which they subsequently diffuse. Secondary or backscattered electrons emitted by surface atoms excited by the electron beam are detected by a detector. The number of these detected electrons depends, among other things, on specimen topography. This is done for different excitation positions on the surface (e.g., by scanning the electron beam over the surface), to obtain an image. Such a CD-SEM image may have a spatial resolution in the order of a nanometer, unparalleled by other metrology techniques employed in this industry. However, there may be a certain amount of noise in such an image.

A major application of CD-SEM is to observe geometrical edges of features (e.g., formed on the substrate in a lithographic process). In doing this, it may be particularly challenging to accurately determine the geometrical shape and position of a feature from a noisy SEM image. There are a number of methods known to improve edge-detection in the presence of significant noise. One such approach uses edge-detection algorithms, which typically smooth/filter the image to reduce the noise; however, in doing this they also affect how the edge is perceived. Alternatively, more noise-robust algorithms make use of reference-SEM signals obtained from a reference geometrical edge, which is subsequently fitted in SEM images. Such an approach, for example, is described in T. Verduin, et al., J. Micro/Nanolith. MEMS MOEMS, 13 033009 (2014), and C. A. Mack, et al., Proc. SPIE 10145, 101451R (2017), both of which are incorporated herein by reference. The validity of these algorithms is questionable, however, when there is significant discrepancy between the reference-SEM signal and the actual SEM signal. Moreover, a fixed reference does not account for local changes in the SEM signal, which may arise from a varying feature shape. An improved approach may comprise extracting the reference-SEM signal from comparable features, by averaging the SEM signal parallel to the edge of a reference target. Such a technique is described in U.S. Pat. No. 7,269,287 B2, incorporated herein by reference in its entirety. This approach, however, excludes local variations in the reference-SEM signal, which may arise as a result of local distortions of the feature. As such, this method uses prior knowledge regarding the edge position of the feature of interest.

Therefore, a method is proposed which obtains the reference-SEM signal from the SEM image itself, rather than a reference image. This means that the proposed method is independent of the sample materials and the SEM settings used. As such, the method allows for local variations in the geometry of both edge shape and position and can iteratively compensate for LER (line edge roughness) and SEM-induced drifts in the edge position.

Figure 2:
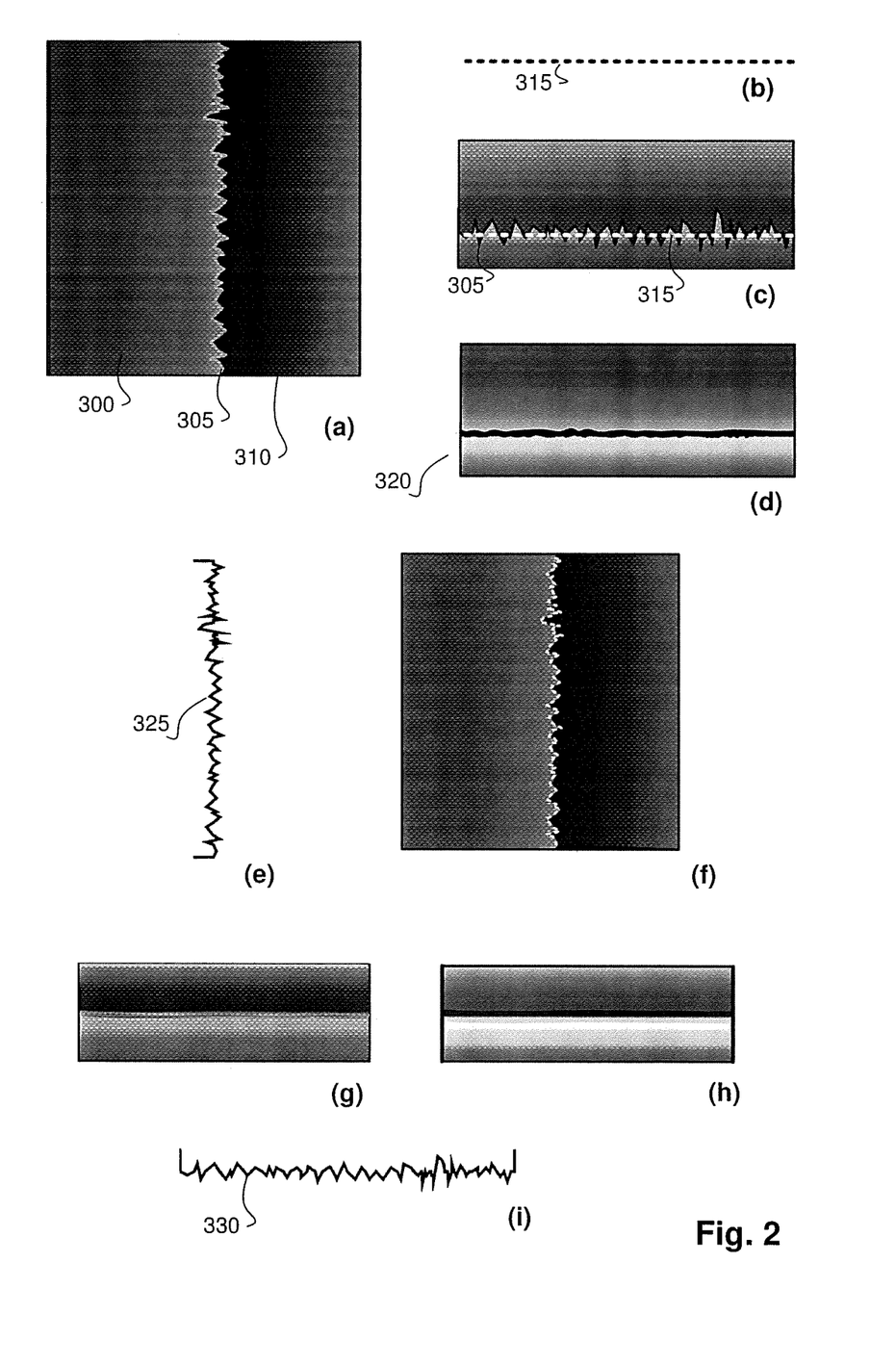
FIG. 2 is a first example flow diagram depicting an exemplary method, consistent with embodiments of the present disclosure.

The proposed method is illustrated by the flow diagram of FIG. 2. FIG. 2(a) comprises a representation of a CD-SEM image showing part of a feature 300 (e.g., a line) having an edge 305 defining it from an adjacent trench 310. The edge 305 has a roughness (i.e., LER) and additionally, is noisy. The method comprises firstly making an initial estimate of the edge position. In this specific example, illustrated in FIG. 2(b), the estimated position is simply a straight line roughly at the position of the edge to be detected, this line being defined as the initial contour 315 (represented by the white dotted line). However, the initial estimate may comprise any contour; e.g., a rough tracing of the edge. At a next step, illustrated by FIG. 2(c), an area comprising either side of this initial contour 315 is selected and shown on a space transformed in relation to the contour (i.e., a graph of parallel to the contour against perpendicular to the contour). This area may be, for example, a few nanometers (e.g., less than 10 nm, or less than 5 nm) either side of contour 315. In this specific example, because the initial contour 315 is a straight line, the plot of FIG. 2(c) (roughly) follows the edge profile which is to be determined. FIG. 2(d) illustrates the result of the next step in which a 1-dimensional low pass filter, e.g., Gaussian smoothing or a Gaussian blur, is applied in the direction parallel to the contour. It should be understood that the Gaussian filter is applied parallel to all points along the contour, i.e., the direction of blurring changes with the direction of the contour (e.g., when not a straight line). As the filter is only applied parallel to the contour, blurring perpendicular to the actual edge is minor. The result of this step is used as a reference-SEM signal 320. More specifically, the columns (of the reference-SEM signal 320 of FIG. 2(d) are assumed to be the local reference-SEM signals. Each column width may be, for example, defined as a pixel width of the images. The columns of the smoothed reference-SEM signals of FIG. 2(d) are fitted/matched to the corresponding columns of FIG. 2(c), allowing only a shift in height difference between corresponding columns. As such, this step comprises a 1-dimensional cross correlation between the (noisy) imaged edge (FIG. 2(c)) and the smoothed (filtered) edge FIG. 2(d), performed on a column-by-column basis, wherein the columns are aligned (matched) perpendicular to the contour 315. As the comparison is made using a local reference, possible variations in the edge shape are also taken into account. The obtained shifts of the column heights represent the displacements due to LER and, as illustrated in FIG. 2(e), are used to define an updated contour 325. In this way, the updated line contour is based upon reference-SEM signal 320 determined from the actual image. As can be seen in FIG. 2(f), the updated line contour (dotted white line) is a much better match to the actual feature edge 305.

Figure 3:
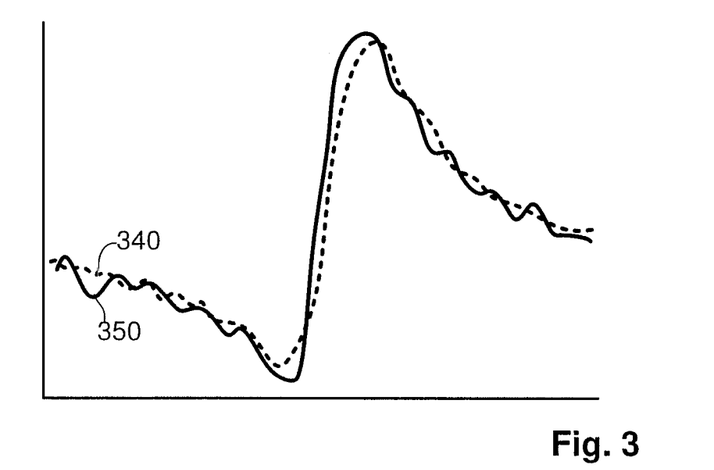
FIG. 3 is a plot of a reference SEM signal following a first and second iteration of the exemplary method, consistent with embodiments of the present disclosure.

Determining the edge contour (a matched contour) based only on a reference-SEM signal 320 from the image itself may not be desirable. Therefore, in some embodiments, an additional thresholding step may be performed on the fitted/matched contour immediately after the matching step (matching the reference-SEM signal 320 to the initial contour 315), to obtain a thresholded contour. The thresholded contour may represent a better estimate of the edge position being determined than the matched (unthresholded) contour. This thresholding step may be performed for each individual column of the matched reference-SEM signal. The thresholding may comprise determining a threshold value (e.g., gray value) which defines the edge location (according to any suitable criteria) and using the threshold value to further define the edge based on the matched image FIG. 3(d) as matched to FIG. 3(c). The concept of thresholding is well known in the art of edge detection and will not be described in any detail here. The thresholding may additionally comprise scaling the minimum and maximum value per column individually to prevent thresholding artifacts which may typically appear when normalizing the minimum and maximum in an area with varying strengths of the SEM signal. The result is an updated contour 325 which is determined from a combination of matching using a reference-SEM signal 320 obtained from the actual image and a thresholding step on the matched image.

In some embodiments, the method may be performed iteratively to improve the edge profile estimate. This comprises repeating the above steps using the updated contour 325 as an input contour (initial contour). The steps of a second iteration are shown in FIGS. 2(g)-2(i). FIG. 2(g) is a plot of the area transformed around updated contour 325 (i.e., a graph of parallel to the contour against perpendicular to the contour). As this contour is now closely matched to the edge profile, this graph shows variation which is close to horizontal. FIG. 2(h) is the smoothed reference-SEM signal following Gaussian smoothing applied parallel to the updated contour 325. Finally, following the matching step and any thresholding, a second iteration updated contour 330 is obtained, as shown in FIG. 2(i).

A comparison of first iteration contour 325 to the initial contour 315 comprises a measure of the LER, while a comparison of the second iteration contour 330 to the first iteration contour 325 shows mostly random noise, other than a few small trends. Indeed, first iteration contour 325 and second iteration contour 330 look very much alike, with the latter only slightly improved compared to the former. This improvement is not necessarily trivial, however, as illustrated by the graph of FIG. 3. This is an example of the reference-SEM signal after a first iteration 340 and after a second iteration 350. From this graph, some discrepancy between the two iterations is evident. As might be expected, the reference-SEM signal in the first iteration 340 is somewhat rounded off near the maximum and minimum compared to that of the second iteration 350.

Figure 4:
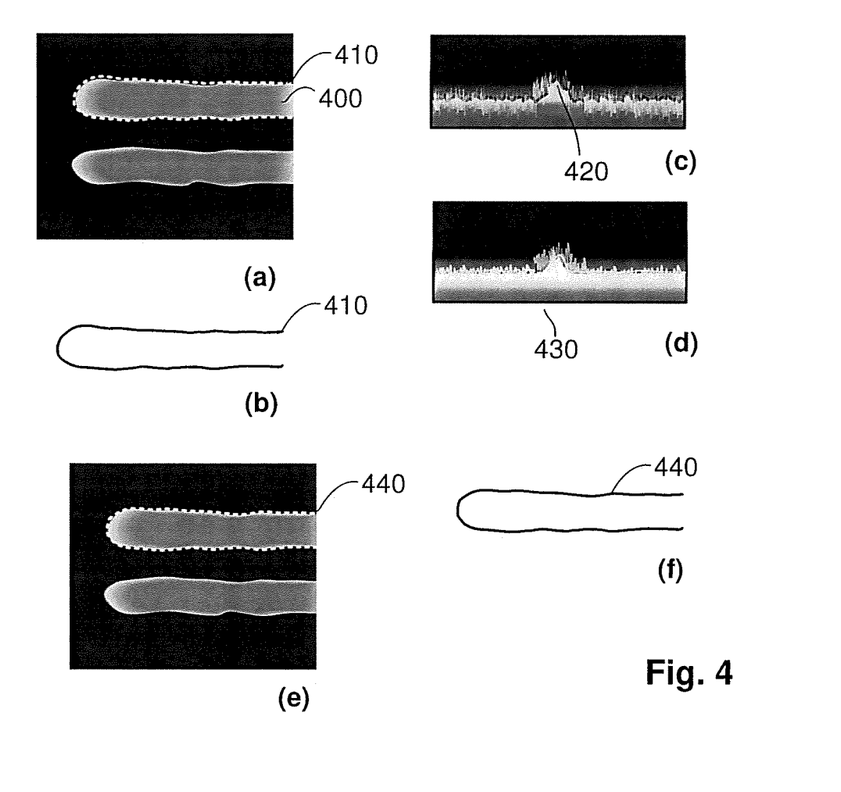
FIG. 4 is a second example flow diagram depicting an exemplary method, consistent with embodiments of the present disclosure.

The previous example shows how a (local) reference-SEM signals can be obtained from a SEM image and how this concept may be used iteratively to compensate for severe LER. As a complementary example, the application of the method to a very different experimental CD-SEM image is shown in FIG. 4. FIG. 4(a) shows experimentally measured resist lines 400 having a more complicated shape, and with an estimated initial contour 410 shown as a dotted white line. This initial contour 410 is shown more clearly in FIG. 4(b). FIGS. 4(c) and (d) show the same steps as FIGS. 2(c) and (d) for this more complex contour 410. Despite the contour 410 being arbitrary shaped, the image can be essentially unfolded (transformed) along this contour. In this unfolding, the local normal to the contour is interpolated and sampled. At around the center of FIG. 4(c), a varying SEM-signal 420 can clearly be observed. This varying SEM-signal 420 corresponds to the tip of the resist line being considered in FIG. 4(a), and is caused by the contour 410 not properly following the geometry at this tip. Averaging parallel to the whole contour would, for this example, likely result in an incorrect reference-SEM signal at the tip of the resist line, and possibly would also be incorrect for the whole resist line. However, it is desirable to average out some of the noise which is present. Therefore, a Gaussian blurring is applied to FIG. 4(c) (e.g., with a sigma of 5 nm) in the direction parallel to the contour, to obtain the reference-SEM signal 430 of FIG. 4(d). It can be observed that reference-SEM signal 430 has an improved signal to noise ratio, while the tip region is still clearly distinguishable. Again, no filtering is done in the perpendicular direction. The columns of FIG. 4(d) are again assumed to be the local reference-SEM signals and are fitted to the identical columns of to FIG. 4(c), allowing only a shift in height difference between the columns (i.e., a cross correlation between the columns of the two images), so as to redefine the contour. The obtained shifts of the column heights represent the displacements and combined (optionally) with thresholding of the edge position in (c), they provide the edge position shown as the new contour line 440 (FIG. 4(e) and FIG. 4(f)) which better matches the actual contour of the feature 400.

The noise in the reference SEM-signal could be further reduced by fitting the signal with a spline function, such that the SEM signal without noise is preserved as much as possible. This can become particularly important when the method is performed iteratively, because the contours may begin also to align with the noise present in the reference SEM signal.

In summary, the proposed methods for detecting geometrical edges described herein takes a reference signal (e.g., reference edge or reference-SEM signal) from the actual image (e.g., the actual SEM image) on which an edge position is being detected, by unfolding an initial contour. This is an improvement over methods such as described in U.S. Pat. No. 7,269,287 B2 which obtains reference-SEM signals from a reference target, and only for examples of straight features and cylindrical symmetric features. In cases where LER is severe or where the initially guessed contour is inaccurate, this approach can be used iteratively, in the sense that the reference-SEM signal can be optimized. Determining the local reference-SEM signals by means of Gaussian blurring parallel to the contour is robust against material variations and changing SEM-settings, especially when the blurring length is taken to be equal or smaller than the beam width used in the SEM hardware. Also, the reference-SEM signal is obtained from an area around the initial contour, while in U.S. Pat. No. 7,269,287, the so-called white-band is used, which is not always well defined, or even present. It is believed that this method can locate an edge on a sub-pixel resolution with a higher accuracy and precision than possible with typically used thresholding methods, particularly when severe LER is present.

The proposed methods are highly flexible; while many CD-SEM analysis tools can only be applied to a single use-case with well defined geometry, these methods allow analysis of arbitrary complex shaped features. This is particularly important for edge placement error metrology.

The embodiments may further be described using the following clauses:

1. A method of determining an edge position relating to an edge of a feature comprised within an image which comprises noise; said method comprising:
determining a reference signal from said image; and
determining said edge position with respect to said reference signal.

2. A method according to clause 1, wherein the image has been obtained using scanning electron microscopy metrology.

3. A method according to clause 1 or 2, wherein said determining a reference signal from said image comprises applying a 1-dimensional low-pass filter to said image in a direction parallel to an initial contour, to obtain a filtered image comprising said reference signal.

4. A method according to clause 3, comprising the step of estimating the initial contour such that the initial contour comprises an initial estimate of the edge being determined.

5. A method according to clause 3 or 4, wherein said 1-dimensional low-pass filter comprises a 1-dimensional Gaussian blur.

6. A method according to clause 5, wherein a blurring length of the Gaussian blur is equal or smaller than a beam width of a beam used to obtain the image.

7. A method according to any of clauses 3 to 6, wherein, prior to application of the 1-dimensional low-pass filter, the method comprises transforming at least a part of the image including said edge, to obtain a transformed image in a transformed space comprising a first dimension defined as parallel to the initial contour and a second dimension defined as perpendicular to the initial contour.

8. A method according to clause 7, wherein only an area less than 10 nm either side of said initial contour is transformed to obtain said transformed image.

9. A method according to clause 7 or 8, comprising matching one of said filtered image and said transformed image to the other of said filtered image and said transformed image to determine a matched contour, said matched contour comprising a matched estimate of said edge position.

10. A method according to clause 9, wherein said matching comprises matching said filtered image to said transformed image on a column-by-column basis.

11. A method according to clause 10, wherein each column is defined by the width of a pixel of said image.

12. A method according to clause 10 or 11, wherein said matching comprises a cross-correlation of the columns of the filtered image and the corresponding columns of the transformed image.

13. A method according to clause 12, wherein the cross-correlation comprises only shifting the columns relative to each other along the column direction to obtain the best match between the filtered image and the transformed image.

14. A method according to any of clauses 9 to 13, comprising an additional thresholding step to the matched contour, based on a threshold value defining the edge position, so as to obtain a thresholded contour, said thresholded contour comprising a thresholded estimate of said edge position.

15. A method according to any of clauses 9 to 14, comprising performing the method iteratively by performing at least one additional iteration of said method, using the matched contour or thresholded contour as the initial contour for each additional iteration.

16. A method according to any preceding clause, wherein said image is obtained for measurement of a parameter relating to the feature so as to monitor performance of a lithographic process for forming said feature.

17. A method according to clause 16, wherein said parameter comprises one or more of: critical dimension, line edge roughness, line width roughness, local critical dimension uniformity and edge placement error.

18. A method according to any preceding clause, comprising performing a further noise reduction step on said reference signal by fitting a spline function to the reference signal which maximizes signal to noise.

19. A computing apparatus comprising a processor, and being configured to perform the method of any preceding clause.

20. A scanning electron microscopy inspection apparatus being operable to image one or more features on a substrate, and comprising the computing apparatus of clause 19.

21. A computer program comprising program instructions operable to perform the method of any of clauses 1 to 18 when run on a suitable apparatus.

22. A non-transient computer program carrier comprising the computer program of clause 21.

The terms "radiation" and "beam" used in relation to the lithographic apparatus encompass all types of electromagnetic radiation, including ultraviolet (UV) radiation (e.g., having a wavelength of or about 365, 355, 248, 193, 157 or 126 nm) and extreme ultra-violet (EUV) radiation (e.g., having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

As used herein, unless specifically stated otherwise, the term "or" encompasses all possible combinations, except where infeasible. For example, if it is stated that a component may include A or B, then, unless specifically stated otherwise or infeasible, the component may include A, or B, or A and B. As a second example, if it is stated that a component may include A, B, or C, then, unless specifically stated otherwise or infeasible, the component may include A, or B, or C, or A and B, or A and C, or B and C, or A and B and C.

The foregoing description of the specific embodiments will so fully reveal the general nature of the disclosed embodiments that others can, by applying knowledge within the skill of the art, readily modify or adapt for various applications such specific embodiments, without undue experimentation, without departing from the general concept of the present disclosure. Therefore, such adaptations and modifications are intended to be within the meaning and range of equivalents of the disclosed embodiments, based on the teaching and guidance presented herein. It is to be understood that the phraseology or terminology herein is for the purpose of description by example, and not of limitation, such that the terminology or phraseology of the present specification is to be interpreted by the skilled artisan in light of the teachings and guidance.

The breadth and scope of the embodiments of the present disclosure should not be limited by any of the above-described exemplary embodiments but should be defined only in accordance with the following claims and their equivalents.

The invention claimed is:

1. A non-transitory computer readable medium storing a set of instructions that are executable by one or more processors of an apparatus to cause the apparatus to perform a method for determining an edge position relating to an edge of a feature, the method comprising:
determining a reference signal from an inspection image by applying a 1-dimensional low-pass filter to the inspection image; and
determining the edge position based on a matched edge-contour and a threshold characteristic of the inspection image, the matched edge-contour comprising a matched estimate of the edge position based on the reference signal.

2. The non-transitory computer readable medium of claim 1, wherein the set of instructions that are executable by one or more processors of the apparatus to cause the apparatus to further perform generating a filtered image comprising the reference signal.

3. The non-transitory computer readable medium of claim 1, wherein the set of instructions that are executable by one or more processors of the apparatus to cause the apparatus to further perform estimating an initial contour such that the initial contour comprises an initial estimate of the edge being determined.

4. The non-transitory computer readable medium of claim 3, wherein the set of instructions that are executable by one or more processors of the apparatus to cause the apparatus to further perform transforming, prior to applying the 1-dimensional low-pass filter, at least a part of the inspection image of the edge to obtain a transformed image in a transformed space comprising a first dimension substantially parallel to the initial contour.

5. The non-transitory computer readable medium of claim 4, wherein the set of instructions that are executable by one or more processors of the apparatus to cause the apparatus to further perform matching one of the filtered image and the transformed image to the other of the filtered image and the transformed image to determine the matched edge-contour.

6. The non-transitory computer readable medium of claim 5, wherein matching comprises matching the filtered image to the transformed image on a column-by-column basis, and wherein each column is defined by the width of a pixel of the inspection image.

7. The non-transitory computer readable medium of claim 6, wherein matching further comprises cross-correlating a column of the filtered image and a corresponding column of the transformed image.

8. The non-transitory computer readable medium of claim 1, wherein the set of instructions that are executable by one or more processors of the apparatus to cause the apparatus to further perform determining the threshold characteristic of each column of a matched reference signal associated with the matched edge-contour, the threshold characteristic comprising a threshold gray scale value.

9. The non-transitory computer readable medium of claim 8, wherein determining the threshold characteristic comprises scaling a minimum and a maximum gray scale value for each column of the matched reference signal.

10. The non-transitory computer readable medium of claim 5, wherein the set of instructions that are executable by one or more processors of the apparatus to cause the apparatus to further perform iteratively matching the filtered image and the transformed image by performing at least one additional iteration, using the matched edge-contour as the initial contour for each additional iteration.

11. The non-transitory computer readable medium of claim 1, wherein the image is obtained for measurement of a parameter relating to the feature so as to monitor performance of a lithographic process for forming the feature.

12. The non-transitory computer readable medium of claim 11, wherein the parameter comprises at least one of a critical dimension, a line-edge roughness, a line-width roughness, a local critical dimension uniformity, or an edge placement error.

13. An apparatus, comprising:
a memory storing a set of instructions; and one or more processors configured to execute the set of instructions to cause the apparatus to perform:

determining a reference signal from an inspection image by applying a 1-dimensional low-pass filter to the image in a direction parallel to an initial contour; and determining an edge position based on a matched edge-contour and a threshold characteristic of the inspection image, the matched edge-contour comprising a matched estimate of the edge position based on the reference signal.

14. The apparatus of claim 13, wherein the one or more processors are configured to execute the set of instructions to cause the apparatus to further perform generating a filtered image comprising the reference signal.

15. The apparatus of claim 13, wherein the one or more processors are configured to execute the set of instructions to cause the apparatus to further perform:

estimating an initial contour such that the initial contour comprises an initial estimate of the edge being determined; and transforming, prior to applying the 1-dimensional low-pass filter, at least a part of the inspection image including the feature to obtain a transformed image in a transformed space comprising a first dimension substantially parallel to the initial contour.

16. The apparatus of claim 15, wherein the one or more processors are configured to execute the set of instructions to cause the apparatus to further perform:

matching one of the filtered image and the transformed image to the other of the filtered image and the transformed image to determine the matched edge-contour, wherein matching comprises matching the filtered image to the transformed image on a column-by-column basis, and wherein each column is defined by the width of a pixel of the inspection image.

17. The apparatus of claim 13, wherein the one or more processors are configured to execute the set of instructions to cause the apparatus to further perform determining the threshold characteristic of each column of a matched reference signal associated with the matched edge-contour, the threshold characteristic comprising a threshold gray scale value.

18. A method for determining an edge position relating to an edge of a feature, the method comprising:

determining a reference signal from an inspection image by applying a 1-dimensional low-pass filter to the image in a direction parallel to an initial contour; and determining an edge position based on a matched edge-contour and a threshold characteristic of the inspection image, the matched edge-contour comprising a matched estimate of the edge position based on the reference signal.

* * * * *